United States Patent
Assal et al.

(10) Patent No.: US 7,582,919 B2
(45) Date of Patent: Sep. 1, 2009

(54) FUNCTIONAL COATING OF THE SCFM PREFORM

(75) Inventors: Jérôme Assal, Zürich (CH); Stefan Kaufmann, Aarau (CH)

(73) Assignee: ABB Schweiz AG, Baden (CH)

( * ) Notice: Subject to any disclaimer, the term of this patent is extended or adjusted under 35 U.S.C. 154(b) by 426 days.

(21) Appl. No.: 10/524,891

(22) PCT Filed: Aug. 15, 2003

(86) PCT No.: PCT/CH03/00551

§ 371 (c)(1),
(2), (4) Date: Oct. 31, 2005

(87) PCT Pub. No.: WO2004/017406

PCT Pub. Date: Feb. 26, 2004

(65) Prior Publication Data

US 2006/0087023 A1    Apr. 27, 2006

(30) Foreign Application Priority Data

Aug. 16, 2002  (EP) .................................. 02405701

(51) Int. Cl.
*H01L 23/48* (2006.01)
(52) U.S. Cl. .............................. 257/178; 257/E23.187; 257/181; 257/690; 257/727; 257/734; 361/687
(58) Field of Classification Search .......... 257/E23.078, 257/E23.187, E25.016, E23.006, E23.109, 257/720, 713, 675, 178, 734, 727, 118, 181, 257/690; 361/687, 688; 428/556
See application file for complete search history.

(56) References Cited

U.S. PATENT DOCUMENTS

| | | | |
|---|---|---|---|
| 3,280,383 A | | 10/1966 | Emeis |
| 3,686,539 A | * | 8/1972 | Schwartzman ............... 257/745 |
| 4,816,424 A | | 3/1989 | Watanabe et al. |
| 4,876,588 A | * | 10/1989 | Miyamoto .................. 257/706 |
| 5,008,735 A | | 4/1991 | Edmond et al. |
| 6,426,561 B1 | * | 7/2002 | Lang et al. ................... 257/779 |
| 6,448,645 B1 | * | 9/2002 | Kimura et al. ............... 257/735 |
| 6,495,924 B2 | * | 12/2002 | Kodama et al. ............. 257/785 |
| 6,579,623 B2 | * | 6/2003 | Kurihara et al. ............. 428/556 |
| 6,686,658 B2 | * | 2/2004 | Kodama et al. ............. 257/727 |
| 6,703,707 B1 | * | 3/2004 | Mamitsu et al. ............. 257/718 |
| 6,831,351 B2 | * | 12/2004 | Hirao et al. .................. 257/625 |
| 6,906,935 B2 | * | 6/2005 | Nakamura et al. .......... 363/144 |
| 6,946,730 B2 | * | 9/2005 | Teshima ..................... 257/718 |

OTHER PUBLICATIONS

International Preliminary Examination Report dated Feb. 11, 2005.

* cited by examiner

*Primary Examiner*—Chris Chu
(74) *Attorney, Agent, or Firm*—Buchanan Ingersoll & Rooney PC

(57) ABSTRACT

The invention relates to a power semiconductor module having at least one semiconductor chip (11) made of a semiconductor material and having a first and a second main electrode (12, 13), a first and a second main connection (91, 92) and a contact lamina (2) in electrical contact with the first main electrode (12) and the first main connection (92). The contact lamina (2) contains an alloying partner which can form a eutectic with the semiconductor material. According to the invention, the contact lamina is coated with an electrically conductive protective layer (31, 32) that prevents formation of a fixed material connection between the first main electrode (12) and the contact lamina (2).

10 Claims, 1 Drawing Sheet

FUNCTIONAL COATING OF THE SCFM PREFORM

TECHNICAL FIELD

The present invention is concerned with the field of power electronics. It relates to a power semiconductor module according to the preamble of the first claim, in particular an IGBT (insulated gate bipolar transistor) or diode module.

PRIOR ART

In the case of power semiconductor modules, in particular in the case of power semiconductor modules which comprise at least one first semiconductor chip having an IGBT or diode structure internally, a short-circuit strength is often intended to be ensured. In this case, short-circuit strength is understood to mean the fact that a stable short circuit forms in the case of a defect in a first semiconductor chip between a first main connection of the power semiconductor module, which is electrically connected to a first main electrode of the first semiconductor chip, and a second main connection of the semiconductor module, which is electrically connected to a second main electrode of the first semiconductor chip. In a resultant short-circuit mode, a permanent electrical contact with the lowest possible resistance and the highest possible current capacity is intended to exist between the two main connections. For this reason, the technical jargon in English includes the term "short circuit failure mode", SCFM for short. The European patent application published under EP 989611 A2 describes how such short-circuit strength is achieved with the aid of a suitable contact element that is in contact with the first main electrode of each semiconductor chip. The contact element is formed by an electrically conductive layer, for example a lamina, a slice or a foil, and must contain an alloying partner that can form a eutectic with a semiconductor material of the semiconductor chip, that is to say a compound or alloy whose melting point is lower than the melting point of the pure semiconductor material and at the same time lower than the melting point of the pure alloying partner. In the event of a defect in the first semiconductor chip, the latter melts to form a eutectic with the alloying partner and a metallically conductive channel forms between the first and second main electrodes.

For semiconductor chips made of Si, in particular Al, Ag, Au, Cu or Mg or else a compound of these elements is suitable as alloying partner. In the case of pressure-contact-connected power semiconductor modules, a foil or a lamina may advantageously be placed as contact element onto the first main electrode of each semiconductor chip and be fixed by pressure transmitted by means of contact plungers, by way of example.

In the case of a configuration of this type, however, problems can arise due to the fact that a fixed material connection between first main electrode and foil or lamina forms over the course of time and can be released only with great expenditure of force, which generally entails destruction of the first main electrode and thus of the semiconductor chip. This is caused by the fact that the foil or the lamina is as it were cold-welded to the first main electrode on account of the pressure exerted and on account of temperature fluctuations and cycles during operation of the power semiconductor module. During operation of the power semiconductor module, different coefficients of thermal expansion between the contact element and the semiconductor chip result in a severe mechanical loading on the first main electrode, which may have the effect that an electrode metallization becomes detached over the course of time, as a result of which the semiconductor chip is destroyed. In unfavorable cases, this phenomenon may even occur just as a result of friction between the surfaces of the contact element and the first main electrode, that is to say without a fixed material connection having formed.

A further problem arises in the case of power semiconductor modules not sealed in airtight fashion in conjunction with a contact element which substantially comprises Al. It is generally known that Al forms an oxide layer a few nanometers thick within seconds as soon as it comes into contact with air at room temperature. Since said layer is insulating and, moreover, generally harder than the electrode metallization of the first main electrode, it increases a contact resistance between the contact element and the first main electrode, in the worst case to such a great extent that, during operation of the power semiconductor module, heat generated by the contact resistance destroys the power semiconductor module.

SUMMARY OF THE INVENTION

Consequently, it is an object of the invention to specify a short-circuit-proof power semiconductor module having at least one semiconductor chip which has a contact element in the case of which the problems mentioned in the last section do not occur.

This and further objects are achieved by means of a power semiconductor module of the type mentioned in the introduction having the features of the independent patent claim. Further advantageous refinements of the invention are specified in the dependent claims.

The power semiconductor module according to the invention has, as contact element, an electrically conductive contact lamina which is electrically conductively connected to a first main electrode of the semiconductor chip and a first main connection of the power semiconductor module and which is coated with an electrically conductive protective layer. In this case the protective layer is preferably configured such that it has, at an external contact area, a material which

- is as far as possible non-oxidizable, and preferably exhibits little chemical reactivity, or
- does not react chemically with a first electrode metallization of the first main electrode and as far as possible exhibits neither contact corrosion nor material diffusion, or
- has a lowest possible coefficient of friction, or
- can be deposited at temperatures at which the contact layer is not damaged or deformed, or which has an arbitrary combination of two or more of the properties mentioned.

In a preferred development of the power semiconductor module according to the invention, the protective layer has a layered structure and comprises at least one surface layer, which forms the external contact area, and a base layer. In this case, the surface layer is formed from a material which has one of the properties mentioned in the last paragraph or an arbitrary combination of two or more of said properties.

These and further objects, advantages and features of the invention will become apparent from the following detailed description of a preferred exemplary embodiment of the invention in conjunction with the drawing.

WAYS OF EMBODYING THE INVENTION

Figure 1:
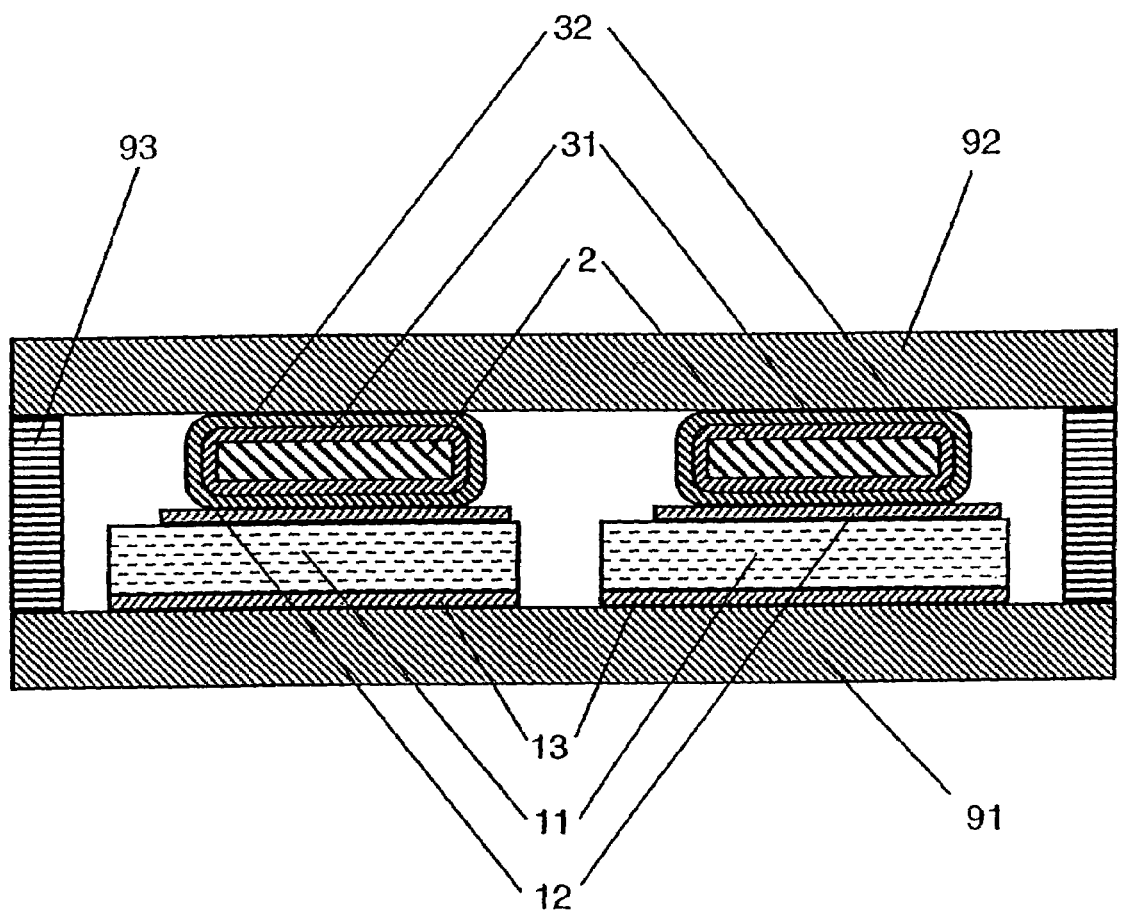
FIG. 1 schematically shows a cross section through a power semiconductor module according to the invention.

FIG. 1 schematically shows a cross section through a power semiconductor module according to the invention.

A semiconductor chip 11 having a first and a second main electrode is situated between an electrically conductive baseplate 91, which forms a second main connection of the power semiconductor module, and an electrically conductive covering plate 92, which forms a first main connection of the power semiconductor module. First and second main electrodes have a first and second electrode metallization 12 and 13, respectively. A contact lamina 2 is situated between first main electrode and covering plate 92, said contact lamina being coated with a protective layer comprising a base layer 31 and a surface layer 32. The module is closed off by side walls 93, in which case this closure need not necessarily be hermetic. In this case, a first thickness of the contact lamina 2 preferably amounts to at least half of a second thickness of the semiconductor chip 11. In this case, the contact lamina 2 may advantageously be obtained by cutting out or stamping out from a foil. Preferably, however, use is made of an even thicker contact lamina 2 having a first thickness in the range of a few tenths of a millimeter to a few millimeters, preferably having a first thickness of approximately one millimeter. In this case, the contact lamina 2 may advantageously be produced by cutting out or stamping out from a metal sheet.

The contact lamina 2 preferably substantially comprises Al or Ag. These materials are, on the one hand, relatively cost-effective. It has emerged, moreover, that the formation of a eutectic is effected particularly reliably in the case of Si as semiconductor material with contact lamina 2 made of Ag and Al and extends through the entire semiconductor chip 11. This can be attributed inter alia to the fact that Ag and Al do not form any intermediate phases with Si. Intermediate phases are understood to be mixtures having a quantitative ratio within a certain bandwidth or else a strictly stoichiometric quantitative ratio, which are characterized by specific physical properties. Such intermediate phases are relatively stable and impede a diffusion process, so that alloying through the semiconductor chip 11 is no longer guaranteed. However, the contact lamina 2 may advantageously also substantially comprise Cu, Au or Mg or an alloy made of two or more of the metals Al, Ag, Au, Cu or Mg.

The surface layer 32 preferably substantially comprises a noble metal, advantageously Ag, Au, Pd, Rh or Ru. Preferably, the surface layer 32 has a third thickness of 0.1 μm to 5 μm, preferably of approximately 0.2 μm.

Preferably, the surface layer 32 may also substantially comprise an electrically conductive nitride, advantageously TiN, CrN or ZrN, or graphite. In this case, the third thickness is preferably 1 μm to 5 μm, preferably approximately 1 μm. Here and hereinafter "A substantially comprises X" is understood to mean that X is that substance having the largest proportion by weight of all the substances X, Y, Z, . . . contained by the article A. In this case, X preferably has a proportion by weight of at least 90%. However, A may advantageously also comprise pure X.

In a preferred refinement of the invention, the contact lamina 2 substantially comprises Al or Mg, and the protective layer has a base layer 31 made of a good covering material, preferably chemically deposited or electrodeposited Ni. In this case, a fourth thickness of the base layer 31 is preferably a few micrometers, preferably approximately between 1 and 15 micrometers, preferably approximately between 2 and 3 micrometers. In this case, the base layer 31 prevents contact corrosion between the contact lamina 2 and the surface layer 32.

In a preferred refinement of the invention, the surface layer 32 substantially comprises Rh, Ru or an electrically conductive nitride, preferably TiN, CrN or ZrN. At customary operating temperatures, Rh has only very weak diffusion, and Ru and nitride even have no diffusion at all, at contacts with a first electrode metallization 12 made of Ag. The formation of a fixed material connection between first electrode metallization 12 and contact lamina 2 is thus prevented in a particularly effective manner. If the contact lamina 2 substantially comprises Al or Mg and the surface layer 32 substantially comprises Ru, the base layer 31 is advantageously somewhat thicker, preferably approximately between 6 μm and 15 μm. This is important particularly when Ru is deposited in an Ru bath in which a pH value of approximately 1 typically prevails, and which is highly chemically aggressive for this reason. Moreover, a thin gold layer is advantageously provided between the base layer 31 made of Ni and the surface layer 32 in order to improve an adhesion between Ni and Ru. In this case, a fifth thickness of the gold layer preferably lies in the region of a few tenths of a micrometer; it is preferably approximately 0.2 micrometer.

In a preferred refinement of the invention, the protective layer comprises only an individual layer, preferably comprising a noble metal, advantageously substantially comprising Ag, Au, Pd, Rh or Ru. In this case, a sixth thickness of the protective layer is preferably between 0.1 μm and 5 μm, preferably approximately 0.2 μm. Preferably, the surface layer 32 may also substantially comprise an electrically conductive nitride, advantageously TiN, CrN or ZrN, or graphite. In this case, the sixth thickness of the protective layer is preferably between 0.1 μm and 5 μm, preferably approximately 1 μm.

LIST OF REFERENCE SYMBOLS

11 Semiconductor chip
12 First electrode metallization of the first main electrode
13 Second electrode metallization of the second main electrode
2 Contact lamina
31 Base layer
32 Surface layer
91 Baseplate
92 Covering plate
93 Side wall

The invention claimed is:

1. A power semiconductor module comprising
at least one semiconductor chip made of a semiconductor material and having first and a second main electrodes,
first and second main connections,
a contact lamina in electrical contact with the first main electrode and the first main connection,
the contact lamina containing an alloying partner capable of forming an eutectic between the alloying partner and the semiconductor material,
the contact lamina being coated with an electrically conductive protective layer, wherein
the protective layer has at least one electrically conductive base layer applied on the contact lamina, and an electrically conductive surface layer, which forms an external contact area, the base layer and the surface layer substantially comprise different materials, and the surface layer is present between the contact lamina and the first main connection and between the contact lamina and the semiconductor chip.

2. The power semiconductor module as claimed in claim 1, wherein the base layer comprises Ni and has a thickness of approximately 1 μm to 5 μm.

3. The power semiconductor module as claimed in claim 2, wherein the thickness of the base layer is approximately 2 μm to 8 μm.

4. The power semiconductor module as claimed in claim 1, wherein the surface layer has a thickness of approximately 0.1 μm to 5 μm.

5. The power semiconductor module as claimed in claim 1, wherein the semiconductor chip internally has an IGBT structure or a diode structure.

6. The power semiconductor module as claimed in claim 1, wherein the base layer comprises a good covering material, and in that the surface layer comprises a material having one or more of the following properties:

a non-oxidizable, exhibiting little chemical reactivity, b does not react chemically with a first electrode metallization of the first main electrode and exhibits neither contact corrosion nor material diffusion, c has a low coefficient of friction, d can be deposited at temperatures at which the contact layer is not damaged or deformed.

7. The power semiconductor module as claimed in claim 1, wherein the surface layer encircles the contact lamina.

8. The power semiconductor module as claimed in claim 1, wherein the surface layer encloses the contact lamina.

9. The power semiconductor module as claimed in claim 1, wherein the surface layer is between the contact lamina and the first main electrode of the semiconductor chip.

10. A power semiconductor module comprising at least one semiconductor chip made of a semiconductor material and having first and a second main electrodes, first and second main connections, a contact lamina in electrical contact with the first main electrode and the first main connection, the contact lamina containing an alloying partner capable of forming an eutectic between the alloying partner and the semiconductor material, the contact lamina being coated with an electrically conductive protective layer, wherein the protective layer has at least one electrically conductive base layer applied on the contact lamina, and an electrically conductive surface layer, which forms an external contact area, the surface layer substantially comprises Ru, an electrically conductive intermediate layer is provided between the surface layer and the base layer, said intermediate layer substantially comprising Au and having a thickness of approximately 0.2 μm, and the base layer has a thickness of 5 μm to 12 μm.

* * * * *